United States Patent
Hovakimyan et al.

(10) Patent No.: US 8,698,659 B2
(45) Date of Patent: Apr. 15, 2014

(54) TIME INTERLEAVED ANALOG TO DIGITAL CONVERTER MISMATCH CORRECTION

(71) Applicant: Tektronix, Inc., Beaverton, OR (US)

(72) Inventors: Karen Hovakimyan, San Jose, CA (US); Pirooz Hojabri, San Jose, CA (US); Masood Yousefi, Cupertino, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 13/684,031

(22) Filed: Nov. 21, 2012

(65) Prior Publication Data

US 2014/0022101 A1    Jan. 23, 2014

Related U.S. Application Data

(60) Provisional application No. 61/674,511, filed on Jul. 23, 2012.

(51) Int. Cl.
    *H03M 1/06*     (2006.01)

(52) U.S. Cl.
    USPC .......................................... 341/118; 341/155

(58) Field of Classification Search
    USPC ................................ 341/118, 155
    See application file for complete search history.

(56) References Cited

U.S. PATENT DOCUMENTS

| | | | |
|---|---|---|---|
| 7,138,933 B2 * | 11/2006 | Nairn | 341/141 |
| 7,227,479 B1 * | 6/2007 | Chen et al. | 341/118 |
| 7,541,958 B2 | 6/2009 | Xu | |
| 7,978,104 B2 * | 7/2011 | Johansson | 341/120 |
| 8,009,070 B2 | 8/2011 | Johansson et al. | |

OTHER PUBLICATIONS

M. Seo, M. J. W. Rodwell, and U. Madhow, "Comprehensive digital correction of mismatch errors for a 400-msamples/s 80-dB SFDR time-interleaved analog-to-digital converter," IEEE Trans. Microw. Theory Tech., vol. 53, No. 3, p. 1072-1082, Mar. 2005.
Håkan Johansson, Per Löwenborg, "A Least-Squares Filter Design Technique for the Compensation of Frequency Response Mismatch Errors in Time-Interleaved A/D Converters," IEEE Transactions on Circuits and Systems—II: Express Briefs, vol. 55, No. 11, pp. 1072-1082, Nov. 2008.
Yong Ching Lim, Yue-Xian Zou, Jun Wei Lee, Shing-Chow Chan, "Time-Interleaved Analog-to-Digital-Converter Compensation Using Multichannel Filters," IEEE Transactions on Circuits and Systems—I: Regular Papers, vol. 56, No. 19, pp. 2234-2247, Oct. 2009.
P. Satarzadeh, B. Levy and P. Hurst, "Polyphase domain approach to blind calibration of timing mismatches for Mchannel time-interleaved ADCs," in Circuits and Systems (ISCAS), Proceedings of 2010 IEEE International Symposium on, May 30-Jun. 2, 2010, pp. 4053-4056.
F. Xu, "Perfect data reconstruction algorithm of time interleaved ADCs," in IEEE International Test Conference, Santa Clara, 2006, pp. 1-6.

(Continued)

*Primary Examiner* — Khai M Nguyen
(74) *Attorney, Agent, or Firm* — Marger Johnson & McCollom PC; Thomas F. Lenihan

(57) ABSTRACT

A machine-implemented method can include receiving a common input signal over M parallel time-interleaved (TI) analog to digital converter (ADC) channels, determining a multiple-input, multiple-output finite impulse response (FIR) filter structure for correcting bandwidth mismatches between the M parallel TIADC channels, and providing a common output signal comprising TI data corresponding to the M parallel TIADC corrected channels.

14 Claims, 5 Drawing Sheets

(56) References Cited

OTHER PUBLICATIONS

K. Asami, "Technique to Improve the Performance of Time-Interleaved A-D converters," in IEEE International Test Conference, Austin, TX, USA, 2005, pp. 1-7.

R. Shenoy, D. Burnside, T. Parks, "Linear Periodic Systems and Multirate Filter Design," IEEE Transactions on Signal Processing, vol. 42, No. 9, pp. 2242-2256, 1994.

M. Vetterli, "A Theory of Multirate Filter Banks," IEEE Transactions on Acoustics, Speech, and Signal Processing, vols. ASSP-35, No. 3, pp. 356-372, Mar. 1987.

* cited by examiner

TIME INTERLEAVED ANALOG TO DIGITAL CONVERTER MISMATCH CORRECTION

CROSS-REFERENCE TO RELATED APPLICATION

The present application claims the benefit of U.S. Provisional Patent Application No. 61/674,511, titled "TIME INTERLEAVED ANALOG TO DIGITAL CONVERTER MISMATCH CORRECTION" and filed on Jul. 23, 2012, the content of which is hereby fully incorporated by reference herein.

TECHNICAL FIELD

Embodiments of the disclosed technology generally relate to Analog to Digital Converters (ADCs) and, more particularly, to correction of mismatches between Time Interleaved (TI) ADC outputs.

BACKGROUND

Current techniques include frequency domain implementations of corrections that are specifically directed to processing frames of data, see, e.g., U.S. Pat. No. 7,541,958. In other current techniques, a linear M-periodic system can be represented in the frequency domain by M×M matrixes (where M is the number of time interleaved ADC channels in our case). In order to get such representation, the distinct sets of M normalized frequencies $$f, f + \frac{1}{M}, \ldots, f + \frac{M-1}{M}$$

are considered. Complex exponents with these frequencies constitute eigen-spaces that are invariant under linear periodic transformations (see, e.g., R. Shenoy, D. Burnside, T. Parks, "Linear Periodic Systems and Multirate Filter Design," IEEE Transactions on Signal Processing, vol. 42, no. 9, pp. 2242-2256, 1994, and M. Vetterli, "A Theory of Multirate Filter Banks," IEEE Transactions on Acoustics, Speech, and Signal Processing, Vols. ASSP-35, no. 3, pp. 356-372, March 1987). In other words, the response of a Time Interleaved Analog to Digital Converter (TIADC) system to the weighted sum of complex exponentials from the same eigen-space is a weighted sum of the same complex exponentials at the same frequencies. This principle can be used for sinewaves instead of complex exponentials. The corresponding set of frequencies for real sinewaves in U.S. Pat. No. 7,541,958 is referred to as a Family of Mutual Alias Frequencies (FMAF). FMAF frequencies may be defined using the following notations: $F_S$—the combined sampling rate of TIADC, M—number of time interleaved ADC channels, and P—an integer multiple of M which specifies frequency grid $f_p$, according to the following:

$$f_p = \frac{F_S}{2P} p, \quad p = 0, 1, \ldots, P \quad (1)$$

Then, the i-th frequency index (i=0,1, ..., M−1) inside the $$k-th \left(k = 1, \ldots, \frac{P}{M} - 1\right)$$

FMAF can be defined as follows:

$$p_i(k) = \begin{cases} k + 2\frac{Pi}{M}, & \text{if } i < \frac{M}{2} \\ -k + 2\frac{P\left(i - \frac{M}{2} + 1\right)}{M}, & \text{if } i > \frac{M}{2} - 1 \end{cases} \quad (2)$$

It should be noted that TIADC input signals with frequencies from the same k-th FMAF have the feature that DFT (Discrete Fourier Transform) at individual ADC outputs will have a single spectral tone at k-th bin.

Frequency domain correction can be derived by matrix multiplication as follows:

$$h_k^{(cor)} = (H_k)^{-1} h_k \quad (3)$$

where $h_k$ represents the vector with the m-th component, $h_k(m)$ representing a DFT in the k-th frequency bin at m-th ADC output before correction, $h_k^{(cor)}$ represents a corresponding vector after correction, and matrix $(H_k)^{-1}$ represents the inverse of the matrix with components $H_k(m,i)$ derived in a calibration stage per DFT computation in the k-th bin at the m-th ADC output when a single tone having i-th frequency from the k-th FMAF was used for calibration. An example of frequency domain correction according to (3) is shown in FIG. 1.

Other techniques are directed to time domain implementation and are suitable for continuous data application, see, e.g., U.S. Pat. No. 8,009,070, which requires inversion of matrixes of size L×L, where L represents the number of finite impulse response (FIR) filter taps.

SUMMARY

Embodiments of the disclosed technology generally pertain to time domain procedures for correction of frequency dependent mismatches of Time Interleaved Analog to Digital Converters (TIADC) systems. Time domain correction may be derived on the basis of frequency domain correction matrixes and represent significant reduction in complexity for finite impulse response (FIR) filter designs compared to previously reported results for time domain correction.

DETAILED DESCRIPTION

Figure 1:
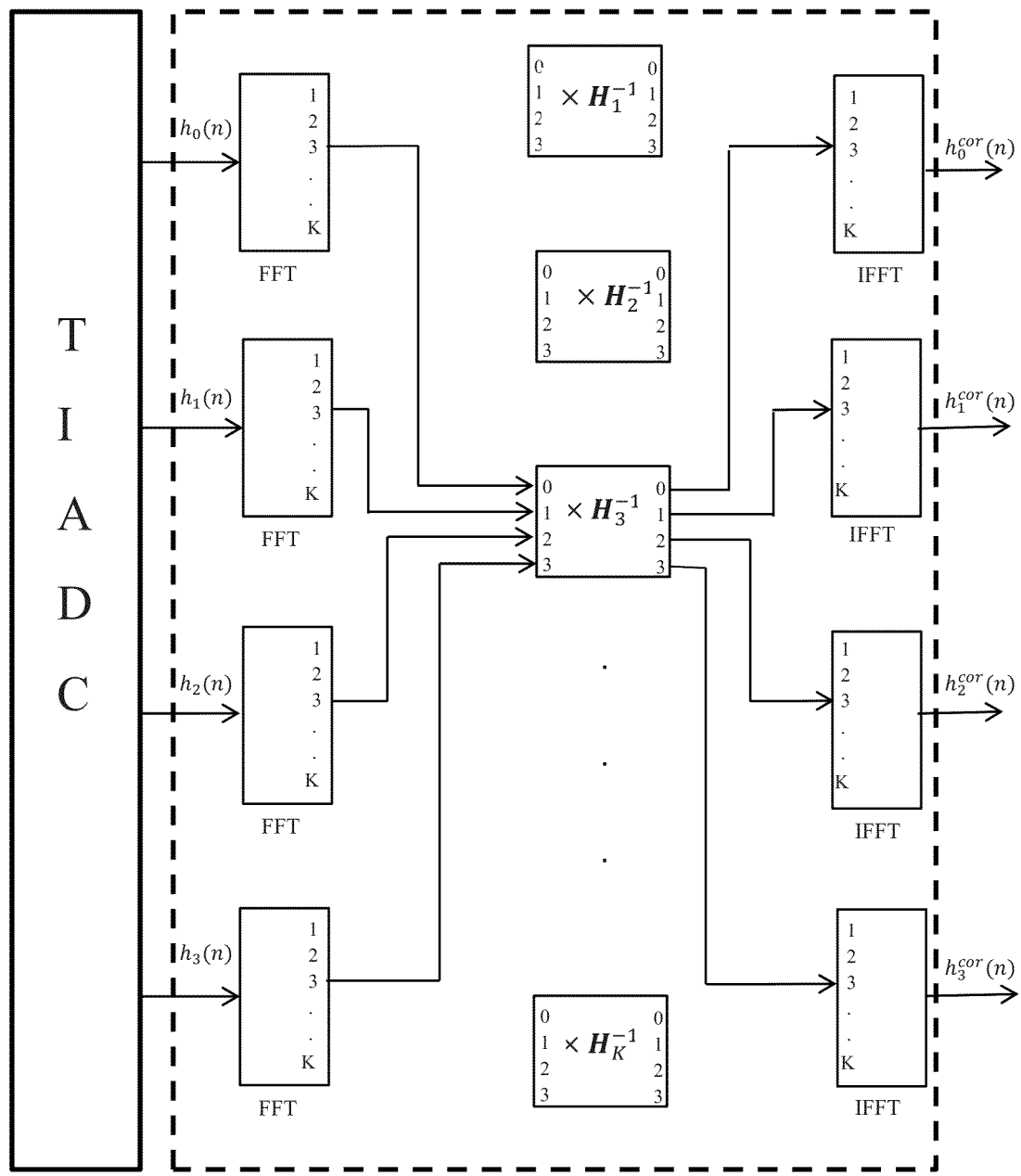
FIG. 1 illustrates an example of a prior implementation of frequency domain correction.
Figure 2:
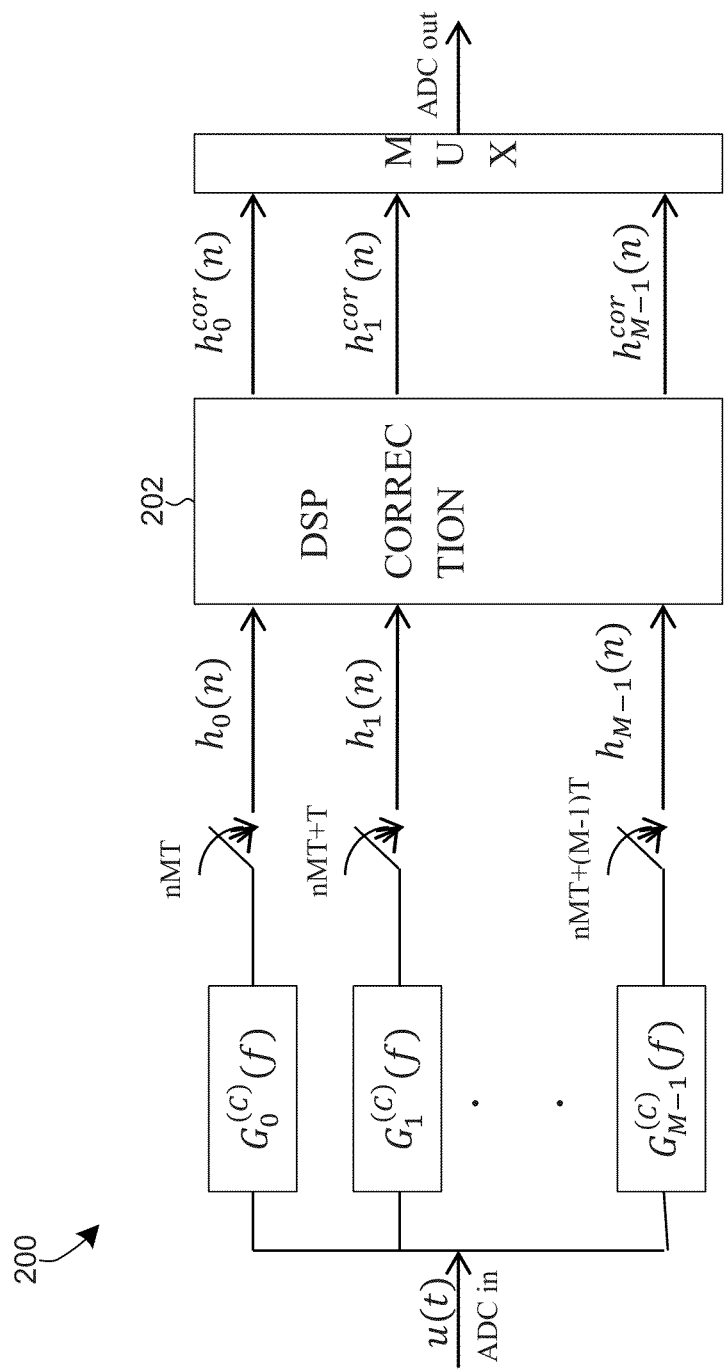
FIG. 2 illustrates an example of a Time Interleaved Analog to Digital Converter (TIADC) system in accordance with certain embodiments of the disclosed technology.

FIG. 2 illustrates an example model of a Time Interleaved Analog to Digital Converter (TIADC) system 200 in accordance with certain embodiments of the disclosed technology. In the example, there are M parallel time-interleaved ADC channels with indexes m=0,1, . . . , M−1. The m-th ADC samples its input signal at time instances nMT+mT. These samples are corrected by a DSP Correction Block 202, which is described in greater detail below with particular regard to FIG. 3. Correction is needed since ADC channels may introduce linear distortion and mismatches.

The Fourier Transform U(f) of a common signal u(t) at the input of the TIADC and m-th ADC Frequency Response $G_m^{(C)}(f)$ (up to the sampling point) yields the following:

$$H_m^{(C)}(f) = U(f) G_m^{(C)}(f) \quad (4)$$

where $H_m^{(C)}(f)$ is Fourier Transform of corresponding analog signal before sampling by m-th ADC. $G_m^{(C)}(f)$, l=0,1, . . . , M−1, and hence $H_m^{(C)}(f)$, include not only frequency dependent gain mismatches but also phase mismatches due to the timing inaccuracy of a TI structure.

The Fourier Transform of a discrete time signal $h_m(n)$ at the m-th TI channel output may be given by the following:

$$H_m^{(D)}(f) = \frac{1}{MT} \sum_{n=-\infty}^{\infty} H_m^{(C)}\left(f - \frac{n}{MT}\right) e^{j2\pi(f - \frac{n}{MT})mT} \quad (5)$$

The TIADC structure may distort the spectrum of the input signal by introducing some frequency dependent changes in magnitude and phase of the signal spectrum. It may also introduce aliasing spurs into the spectrum due to gain and phase mismatches between TI channels. Depending on the application, one may want to recover signal spectrum corresponding to ideal sampler or remove only mismatch spurs trying to improve Spurious-Free Dynamic Range (SFDR) values and make the system look mismatch-free.

Application of a TIADC mismatch correction algorithm generally includes an assumption that a signal at the TIADC input is real and band-limited to $F_S/2$. During a calibration stage, the sine waves having frequencies from Families of Mutual Alias Frequencies (FMAFs) may be applied sequentially and corresponding TIADC outputs may be processed with Discrete Fourier Transform (DFT).

The DFT results may then be compared against desired results, which are expected DFT values in the absence of mismatches or other linear distortions. Based on this comparison, two-dimensional arrays of frequency domain correction coefficients may be computed. Such arrays may include matrixes that may need to be multiplied by TIADC frequency domain outputs to compensate for mismatches. Embodiments of the disclosed technology generally provide techniques for designing FIR filters based at least in part on frequency correction matrixes.

To find correction matrixes in the frequency domain, sets of FMAF frequencies given by (2) for $$k = 1, \ldots, \frac{P}{M} - 1$$

may be extended to include also groups of frequencies corresponding to DC (k=0) and to Nyquist frequency (k=P/M). Frequency indexes of the k-th FMAF are in the k-th column of the following matrix, exemplified for a case in which M=4 and P=32:

$$P\_FMAF = \begin{pmatrix} 0 & 1 & 2 & 3 & 4 & 5 & 6 & 7 & 8 \\ 16 & 17 & 18 & 19 & 20 & 21 & 22 & 23 & 24 \\ 16 & 15 & 14 & 13 & 12 & 11 & 10 & 9 & 8 \\ 32 & 31 & 30 & 29 & 28 & 27 & 26 & 25 & 24 \end{pmatrix} \quad (6)$$

In the example, the first column (k=0) corresponds to frequencies 0, Fs/4, Fs/4, Fs/2. Applying each of these frequencies at the TIADC input will result in the spectral line at 0 frequency (DC) at individual ADC outputs.

Related single tones (e.g., columns of the matrix) may be applied with frequency indexes $p_i(k)$ (i=0,1, . . . , M−1) to obtain corresponding DFT results in the k-th bin, $h_{k,i}$ (with m-th component of the vector, $h_{k,i}(m)$ being k-th bin DFT at m-th ADC output), and to form a matrix from these column vectors:

$$H_k \triangleq (h_{k,0}, h_{k,1}, \ldots, h_{k,M-1}) \quad (7)$$

A matrix for corresponding desired values, discussed in detail below, may be formed as follows:

$$H_k^{(des)} \triangleq (h_{k,0}^{(des)}, h_{k,1}^{(des)}, \ldots, h_{k,M-1}^{(des)}) \quad (8)$$

The frequency domain correction matrix $Q_k$ can be found from $$H_k^{(des)} = Q_k H_k \quad (9)$$

to be $$Q_k = H_k^{(des)} (H_k)^{-1} \quad (10)$$

where all of the matrixes have sizes M by M.

In the example, the first column (k=0) and last column (k=P/M) in index matrix P have two times repeating indexes. Application of the same frequency two times will result in two identical columns in $H_k$. Also, it should be noted that these two columns result in real valued vectors $h_{0,i}$ (DC) and $h_{P/M,i}$ (Nyquist), which means that information about complex amplitude of applied single tones is lost. However, both of these issues (singularity of $H_k$ and loss of information) can be resolved by using 90 degree shifted versions of the same sinewave if the frequency index repeats. The procedure may be repeated for all frequency bins of interest, e.g., for other columns of frequency index matrix P.

In situations where full equalization is required, certain desired values, e.g., vectors $h_{k,i}^{(des)}$, may be the delayed version of distortion-free values. Exciting the TIADC system without distortion with a sinewave at frequency $f_p$ and complex amplitude $A=ae^{j\Phi}$, then the spectrum at the m-th ADC output will be as follows:

$$\hat{H}_m^{(D)}(f) = \frac{F_S}{2M} \left[ e^{2\pi j f_p mT} \sum_{n=-\infty}^{\infty} A \delta\left(f - f_p - \frac{nF_S}{M}\right) + e^{-2\pi j f_p mT} \sum_{n=-\infty}^{\infty} A * \delta\left(f + f_p - \frac{nF_S}{M}\right) \right] \quad (11)$$

where $\delta(x)$ is the delta function and $F_S=1/T$.

In order to replace the continuous spectrum with DFT, an integer number P (e.g., specifying the frequency grid) may be selected and DFT may be calculated at each ADC output at frequency bins as follows:

$$f_k = \frac{F_S}{2P}k, \quad k = 0, 1, \ldots, P/M \tag{12}$$

If single tones are sequentially applied at the TIADC input at frequencies as follows:

$$f_p = \frac{F_S}{2P}p, \quad p = 0, 1, \ldots, P \tag{13}$$

then, based on (11), the DFT at the m-th ADC output may be given by:

$$\hat{H}_m(k) = \tag{14}$$

$$\frac{F_S}{2M}\left[\sum_{n=-\infty}^{\infty} A\delta\left(k - p - \frac{nP}{M}\right)e^{j\frac{2\pi}{P}pm} + \sum_{n=-\infty}^{\infty} A\delta\left(k + p - \frac{nP}{M}\right)e^{-j\frac{2\pi}{P}pm}\right]$$

For m, i=0,1, ..., M−1; k=0,1, ... P/M, the following may be defined:

$$E_{m,i}(k) \triangleq \begin{cases} e^{\frac{j2\pi m p_i(k)}{2P}}, & \text{if } i < M/2 \\ e^{\frac{-j2\pi m p_i(k)}{2P}}, & \text{if } i \geq M/2 \end{cases} \tag{15}$$

Using (15), the DFT for single tone with frequency index $p_i(k)$ (e.g., applied at the input of distortion-free TIADC system) at the m-th ADC output becomes:

$$\hat{H}_{m,i}(k) = \begin{cases} \text{Real}[2\tilde{A}_i(k)E_{m,i}(k)], & \text{if } k = 0 \text{ or } k = P/M \\ \tilde{A}_i(k)E_{m,i}(k), & \text{if } k \neq 0 \text{ or } k \neq P/M \end{cases} \tag{16}$$

where $\tilde{A}_i(k)$ represents a modified complex amplitude of a single tone with frequency index $p_i(k)$ and complex amplitude $A_i(k)=a_i(k)e^{j\phi_i(k)}$ defined by the following:

$$\tilde{A}_i(k) \triangleq \begin{cases} A_i(k), & \text{if } i < M/2 \\ A_i^*(k), & \text{if } i \geq M/2 \end{cases} \tag{17}$$

The following defines the column vector from distortion-free values $\hat{H}_{m,i}(k)$:

$$\hat{h}_{k,i} \triangleq (\hat{H}_{0,i}(k), \hat{H}_{1,i}(k), \ldots \hat{H}_{M,i}(k))^T \tag{18}$$

where $(\ )^T$ denotes transpose.

In order to form vectors of delayed distortion-free values, a delay factor may be defined for i=0,1, ..., M−1; k=0,1, ... $\frac{P}{M}$ and for some delay Δ (where Δ is a delay specified in units of sampling time T):

$$D_i(k, \Delta) \triangleq \begin{cases} e^{\frac{j2\pi\Delta p_i(k)}{2P}}, & \text{if } i < M/2 \\ e^{\frac{-j2\pi\Delta p_i(k)}{2P}}, & \text{if } i \geq M/2 \end{cases} \tag{19}$$

Then:

$$h_{k,i}^{(des)} = \hat{h}_{k,i}D_i(k,\Delta) \tag{20}$$

For full equalization magnitude and phase information about calibration, single tones are generally required in order to form desired vectors $h_{k,i}^{(des)}$ (see, e.g., 20, 19, 18, and 16). In situations where it is more pragmatic to correct only for TI mismatch spurs, the magnitude and phase information is not required since one can choose any of the TIADCs to be a reference and correct mismatches relative to the reference ADC. If the first ADC (m=0) is chosen to be the reference, then $$h_{k,i}^{(des)} \triangleq (H_{0,i}(k), H_{0,i}(k)E_{1,i}(k), \ldots, (H_{0,1}(k)E_{M-1,i}(k))^T \tag{21}$$

where $H_{0,i}(k)$ is the DFT in the k-th bin at the first reference ADC output when a single tone with frequency index $p_i(k)$ is applied. Factor $E_{m,i}(k)$ is defined in (15) and takes into account that the desired value at the m-th ADC output should be delayed by mT relative to the first (m=0) reference ADC output. The delay factor defined by (19) may be applied to all ADC desired outputs in this case as well.

FIR filters may be designed per frequency domain correction matrixes $Q_k$ for time domain implementation of correction algorithms. A FIR filter may be designed per each index pair (l, m) of $Q_k$ with k=0,1, ..., P/M (e.g., first Nyquist zone frequency grid according to (12)). The FIR filter is to be designed given the following set of frequency response samples specified at P/M+1 points:

$$q_{l,m} \triangleq \left(Q_0(l, m), Q_1(l, m), \ldots, Q_{\frac{P}{M}}(l, m)\right) \tag{22}$$

This may be done for all pairs (l, m), which will eventually result in $M^2$ FIR filters because the size of $Q_k$ is M by M (l, m=0,1, ..., M−1). Having designed all $M^2$ FIRs, an M by M correction matrix filter C(z) may be formed with the (l, m)-th entry being $C_{l,m}(z)$, the transfer function of the (l, m)-th filter with coefficients as follows:

$$c_{l,m} \triangleq (c_{l,m}(0), c_{l,m}(1), \ldots, c_{l,m}(N-1))^T \tag{23}$$

Designing $M^2$ FIR filters in which each (l, m)-th filter (l, m=0,1, ..., M−1) is designed by minimizing the weighted squared error (WSE) between corresponding FIR filter actual frequency response samples is as follows:

$$\tilde{q}_{l,m}(k) = \sum_{n=0}^{N-1} c_{l,m}(n)e^{\frac{-j2\pi kn}{(2P/M)}} \tag{24}$$

where the specified frequency response samples $q_{l,m}(k)$, k=0, 1, ..., P/M are given in the first Nyquist zone by (22). For each pair (l, m), l, m=0,1, ..., M−1), a corresponding FIR $c_{l,m}(n)$, n=0,1, ..., N−1 may be found such that the WSE is minimized, with the WSE given by the following:

$$\varepsilon_{l,m} = \sum_{k=0}^{P/M} \beta(k) \left| q_{l,m}(k) - \sum_{n=0}^{N-1} c_{l,m}(n) e^{\frac{-j2\pi kn}{(2P/M)}} \right|^2 \quad (25)$$

where $\beta(k)$ is the weighting factor for k-th frequency bin and is identical for all FIRs (e.g., all (l, m) pairs). The last restriction may be removed if desired and $\beta(k)$ may be replaced by $\beta_{l,m}(k)$.

By introducing vector and matrix notations, the minimization of (25) may be reformulated as a weighted least-squares problem and any minimization methods (e.g., normal equations, differentiation, and completion of squares) may be used to find filter coefficients $c_{l,m}(n)$, $n=0,1,\ldots,N-1$. The following is a DFT-type matrix W:

$$W(k,n) = e^{\frac{-j2\pi kn}{(2P/M)}}, n = 0, 1, \ldots, N-1; k = 0, 1, \ldots, P/M \quad (26)$$

and a weight matrix B:

$$B = \text{diag}(\beta). \quad (27)$$

It may then be shown that corresponding FIR filter coefficients (here represented in a column vector $c_{l,m}$) are as follows:

$$c_{l,m} = (\text{Real}[W^H BW])^{-1} \text{Real}[W^H B q_{l,m}] \quad (28)$$

where $(\;)^H$ denotes complex-conjugate transpose.

To prove (28), index pair (l, m) may be dropped from FIR filter coefficients $c_{l,m}(n)$, $n=0,1,\ldots,N-1$ (where N is the length of a FIR filter, not necessarily same for all $M^2$ FIR filters), and index (l, m) may be dropped from (22) and (25). Desired frequency response may be denoted samples $q(k)$, $k=0,1,\ldots,P/M$ and mean squared error $\epsilon$. A differentiation method may be used to prove (28). Considering $\epsilon$ to be a function of FIR filter coefficients c and using (25), it follows that:

$$\frac{\partial \varepsilon}{\partial c} = 2 \sum_{k=0}^{P/M} \beta(k) \text{Real}[w_k^H w_k] c - 2 \sum_{k=0}^{P/M} \beta(k) \text{Real}[q(k) w_k^H] \quad (29)$$

where $w_k$ refers to the k-th row of matrix W in (26). To find c, gradient vector may be equated to zero and, after application of certain algebraic operations, (28) may be obtained.

The above procedure of finding FIR filter coefficients may repeat $M^2$ times to find $M^2$ FIRs (e.g., one FIR $c_{l,m}$ per each frequency response vector $q_{l,m}$).

It should be noted that the matrix that needs to be inverted in (28) is a real N by N matrix (where N refers to the FIR filter length) and it does not depend on measurements $q_{l,m}$—hence, the values of this matrix can be pre-computed and stored. It should also be noted that, for certain reasonable choices of weighting factors $\beta(k)$, neither matrix inversion is required in the computation of $c_{l,m}$ in (28) nor matrix multiplication by $(\text{Real}[W^*BW])^{-1}$ as it becomes diagonal for the (r, t)-th entry of this matrix is $\text{Real}[\Sigma_{k=0}^{P/M} \beta(k) e^{2j\pi k(r-t)/(2N/M)}]$. This is the case, for example, with $\beta(k)=0$ if k is even, and $\beta(k)=1$ otherwise. Such a choice of is reasonable when the DC, Nyquist, and calibration frequencies' harmonics due to nonlinear distortions need to be avoided. Hence, matrix inversions are required only at the stage of finding frequency correction matrixes by (10) for matrixes of size M by M.

Figure 3:
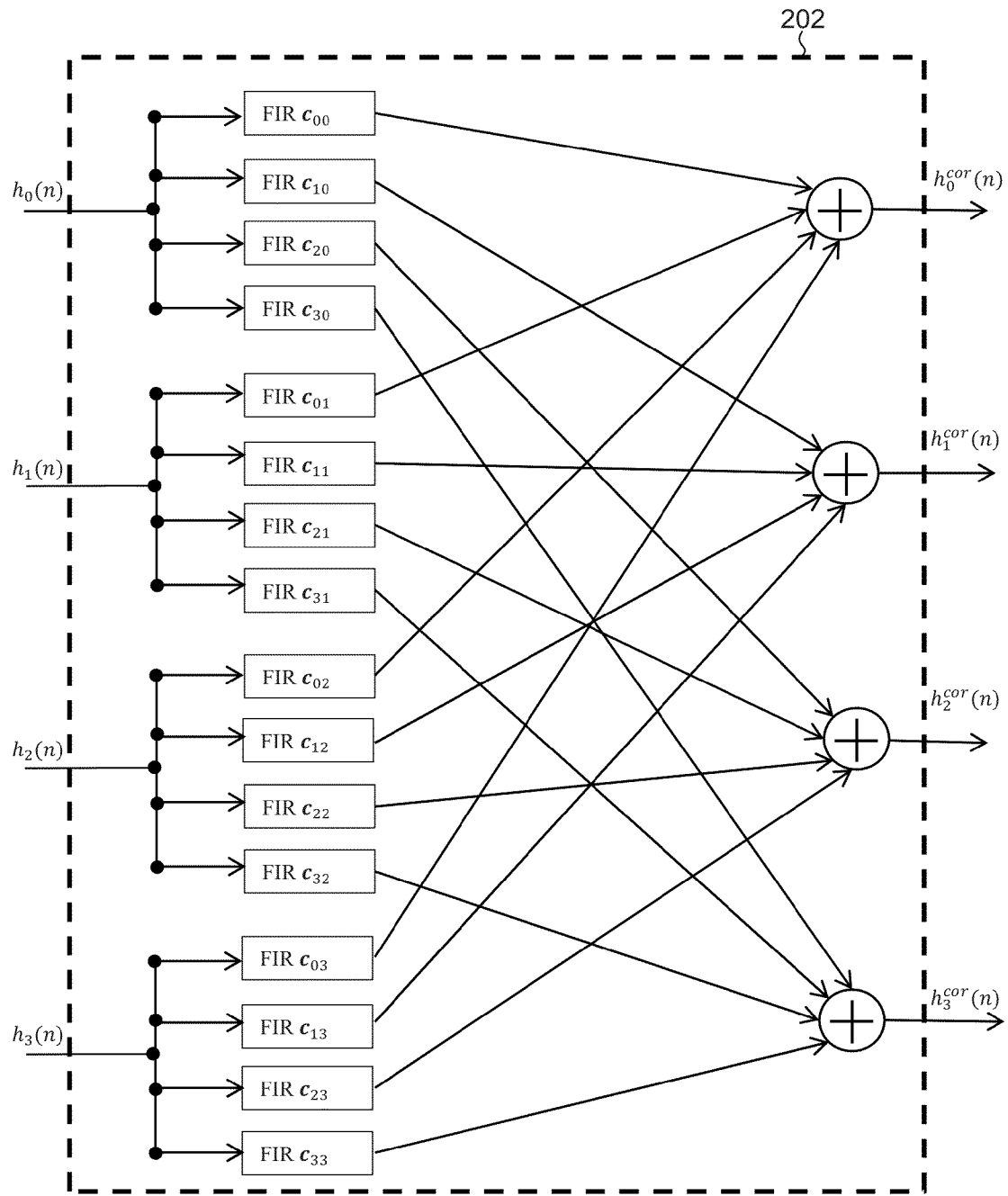
FIG. 3 illustrates an example of a time domain implementation structure of a correction algorithm in accordance with certain embodiments of the disclosed technology.

FIG. 3 illustrates an example of a time domain implementation structure 202 of a correction algorithm in accordance with certain embodiments of the disclosed technology. While the example is exemplified for M=4, one having ordinary skill in the art will appreciate that the correction algorithm may be generalized to other values of M.

A typical matrix filter C(z) according to embodiments has M input streams $H_m(z)$, $m=0,1,\ldots,M-1$ (e.g., corresponding to M ADC outputs) and produces M ouput streams $H_l^{cor}(z)$, $l=0,1,\ldots,M-1$ according to the following:

$$(H_0^{cor}(z), H_1^{cor}(z), \ldots, H_{M-1}^{cor}(z))^T = C(z)(H_0(z), H_1(z), \ldots, H_{M-1}(z))^T \quad (30)$$

The matrix filter C(z) may operate at Fs/M rate and can be viewed as a polyphase time invariant implementation of periodically time varying filter at $F_s$ rate. In the absence of time interleaved mismatches, matrix components of C(z) will generally represent M phases of a decimated time invariant filer and the matrix will have the following structure (for M=4):

$$C(z) = \begin{pmatrix} C_0(z) & C_1(z) & C_2(z) & C_3(z) \\ z^{-1}C_3(z) & C_0(z) & C_1(z) & C_2(z) \\ z^{-1}C_2(z) & z^{-1}C_3(z) & C_0(z) & C_1(z) \\ z^{-1}C_1(z) & z^{-1}C_2(z) & z^{-1}C_3(z) & C_0(z) \end{pmatrix} \quad (31)$$

Figure 4:
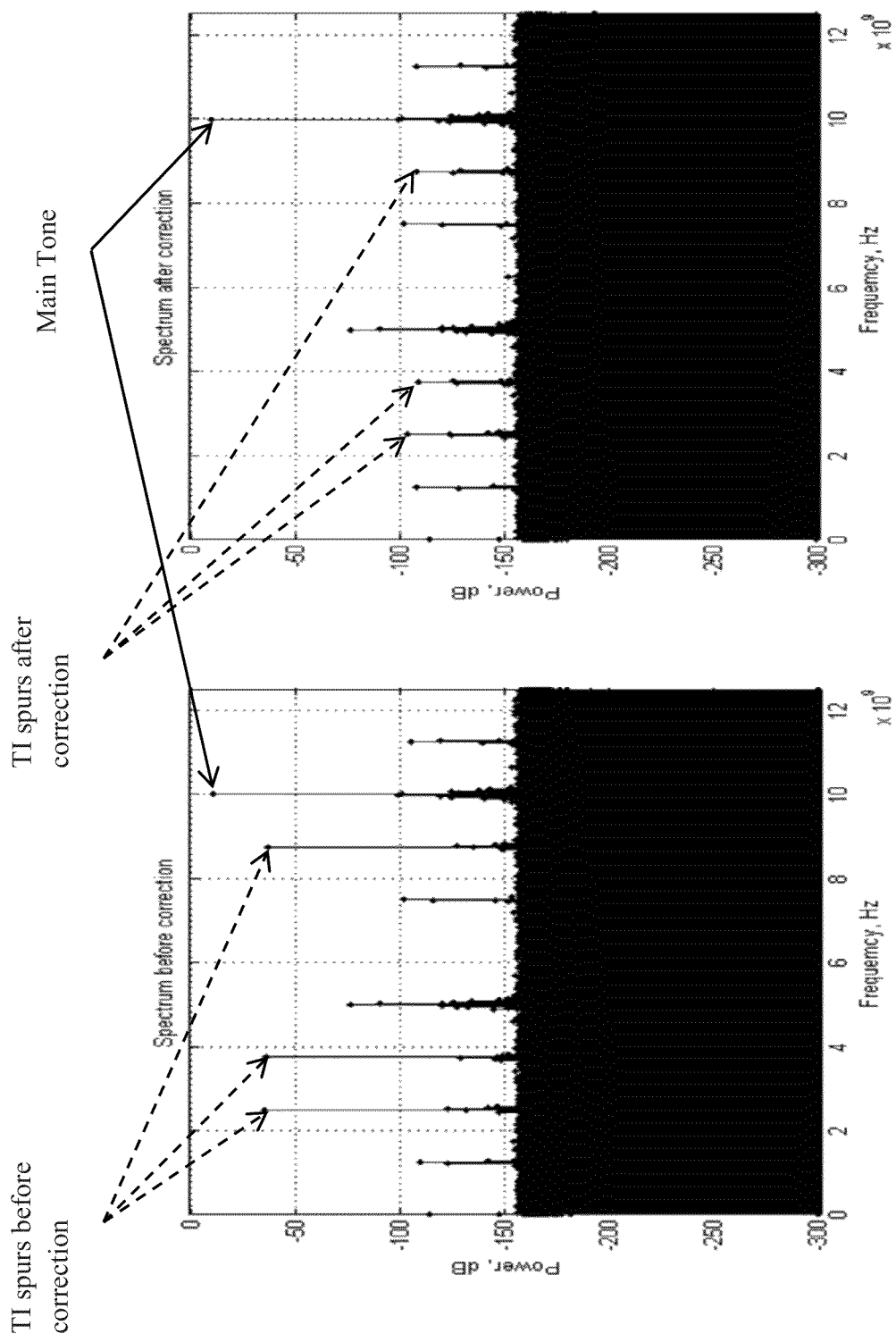
FIG. 4 illustrates an example of a spectrum before and after calibration in accordance with embodiments of the disclosed technology.

FIG. 4 illustrates an example of a spectrum before and after calibration in accordance with embodiments of the disclosed technology. In the example, M=4, $F_s$=25 GS/s, Ftest=10 GHz. Mismatch spurs are improved from 40 dB (e.g., at the input of the DSP correction block) to 100 dB (e.g., at the output of the DSP correction block). Spurs due to mismatches between TIADC channels are improved by more than 60 dB after correction.

Figure 5:
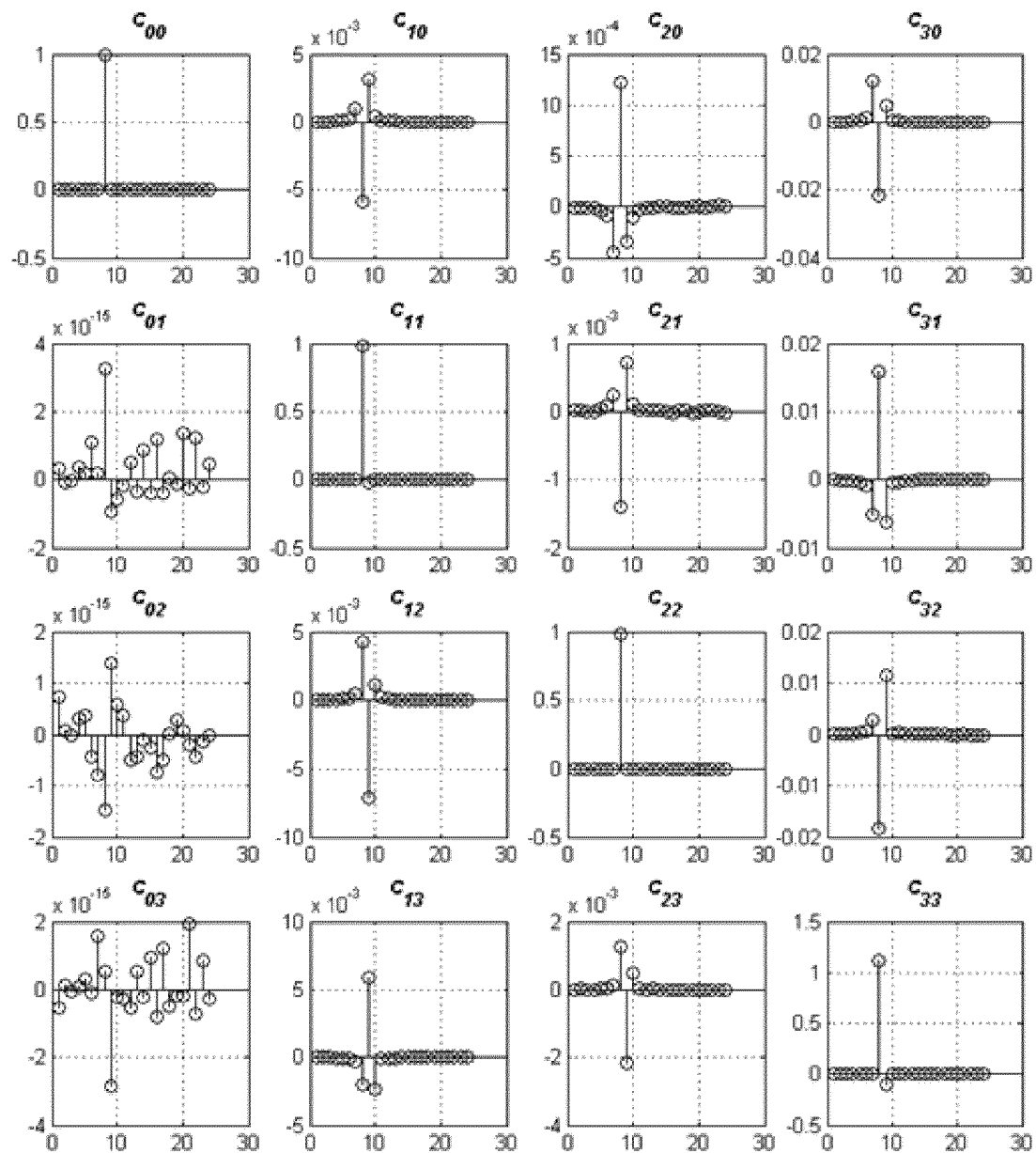
FIG. 5 illustrates an example of various correction finite impulse response (FIR) filter coefficients in accordance with embodiments of the disclosed technology.

FIG. 5 illustrates an example of various correction FIR filter coefficients in accordance with embodiments of the disclosed technology. In the example, the first column has only one significant tap in FIR labeled '$c_{00}$' and all negligible taps values for FIRs labeled '$c_{01}$', '$c_{02}$', '$c_{03}$'. This is a result of correction relative to the first TIADC. In this case, there is no need to implement all 16 FIR filters because 12 FIR filters are enough.

The following discussion is intended to provide a brief, general description of a suitable machine in which embodiments of the disclosed technology or certain portions thereof can be implemented. As used herein, the term "machine" is intended to broadly encompass a single machine or a system of communicatively coupled machines or devices operating together. Exemplary machines can include computing devices such as personal computers, workstations, servers, portable computers, handheld devices, tablet devices, and the like.

Typically, a machine includes a system bus to which processors, memory (e.g., random access memory (RAM), read-only memory (ROM), and other state-preserving medium), storage devices, a video interface, and input/output interface ports can be attached. The machine can also include embedded controllers such as programmable or non-programmable logic devices or arrays, Application Specific Integrated Circuits, embedded computers, smart cards, and the like. The machine can be controlled, at least in part, by input from conventional input devices (e.g., keyboards and mice), as well as by directives received from another machine, interaction with a virtual reality (VR) environment, biometric feedback, or other input signal.

The machine can utilize one or more connections to one or more remote machines, such as through a network interface, modem, or other communicative coupling. Machines can be interconnected by way of a physical and/or logical network, such as an intranet, the Internet, local area networks, wide area networks, etc. One having ordinary skill in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth, optical, infrared, cable, laser, etc.

Embodiments of the disclosed technology can be described by reference to or in conjunction with associated data including functions, procedures, data structures, application programs, instructions, etc. that, when accessed by a machine, can result in the machine performing tasks or defining abstract data types or low-level hardware contexts. Associated data can be stored in, for example, volatile and/or non-volatile memory (e.g., RAM and ROM) or in other storage devices and their associated storage media, which can include hard-drives, floppy-disks, optical storage, tapes, flash memory, memory sticks, digital video disks, biological storage, and other tangible, physical storage media.

Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A machine-implemented method, comprising:
receiving a common input signal over a plurality of M parallel time-interleaved (TI) analog to digital converter (ADC) channels;
determining a multiple-input, multiple-output finite impulse response (FIR) filter structure for correcting bandwidth mismatches between the plurality of M parallel TIADC channels, the structure comprising a plurality of FIR filters; and
providing a common output signal comprising TI data corresponding to the plurality of M parallel TIADC corrected channels.

2. A machine-implemented method according to claim 1, further comprising finding a plurality of FIR filter coefficients for the plurality of FIR filters, the finding comprising inverting a matrix of size M by M, wherein M represents the number of TI channels, and wherein no inversion of an order higher than M is required.

3. A machine-implemented method according to claim 2, wherein the number of FIR filters in the plurality of FIR filters is determined by $M^2$, and wherein finding the plurality of FIR filter coefficients further comprises minimizing a weighted least-square error between a FIR filter frequency response and a desired frequency response in accordance with the following:

$$\varepsilon_{l,m} = \sum_{k=0}^{P/M} \beta(k) \left| q_{l,m}(k) - \sum_{n=0}^{N-1} c_{l,m}(n) e^{\frac{-j2\pi k n}{(2P/M)}} \right|^2$$

where $c_{l,m}(n)$ refers to the n-th coefficients of the FIR labeled with indexes (l, m), l, m=0,1, ..., M−1, $q_{l,m}(k)$ refers to the corresponding FIR desired frequency response, 1/P specifies the frequency grid, and $\beta(k)$ is a weighting factor for the k-th frequency bin and is identical for all FIRs (all (l, m) pairs).

4. A machine-implemented method according to claim 3, where $\beta(k)$ is replaced by $\beta_{l,m}(k)$ when the weighting factors are not necessarily identical.

5. A machine-implemented method according to claim 3, where the corresponding FIR filter coefficients (represented in a column vector $c_{l,m}$) are determined based on the following:

$$c_{l,m} = (\text{Real}[W^H BW])^{-1} \text{Real}[W^H B q_{l,m}]$$

where diagonal matrix B is formed from $\beta(k)$ elements, $q_{l,m}$ is a column vector formed from $q_{l,m}(k)$ elements, and W is a DFT-type matrix defined as the following:

$$W(k, n) = e^{\frac{-j2\pi k n}{(2P/M)}}, n = 0, 1, \ldots, N-1; k = 0, 1, \ldots, P/M.$$

6. A machine-implemented method according to claim 3, wherein desired frequency responses of the $M^2$ FIRs ($q_{l,m}(k)$) are found by (1) forming a frequency correction matrix for a set of frequencies that are invariant under linear periodic transformations, (2) forming a three-dimensional array by stacking frequency correction matrixes for different sets of frequencies using the third dimension, and (3) selecting the desired frequency responses along the third dimension of the three-dimensional array.

7. A machine-implemented method according to claim 6, further comprising a calibration stage comprising:
sending a set of single tones from the set of frequencies that are invariant under the linear periodic transformation and measuring corresponding Discrete Fourier Transforms (DFTs) at the TIADC outputs;
forming a set of desired DFTs;
deriving frequency correction matrixes that transform the measured DFTs into desirable DFTs; and
deriving FIR coefficients from the frequency correction matrixes.

8. A machine-implemented method according to claim 7, wherein the set of desired DFTs include DFTs of a delayed version of mismatch-free TIADC outputs.

9. A machine-implemented method according to claim 7, further comprising forming a matrix of desired DFTs at the TIADC outputs as:

$$H_k^{(des)} \triangleq (h_{k,0}^{(des)}, h_{k,1}^{(des)}, \ldots, h_{k,M-1}^{(des)})$$

where vectors $h_{k,i}^{(des)}$ are defined by:

$$h_{k,i}^{(des)} = \hat{h}_{k,i} D_i(k,\Delta)$$

with $$D_i(k,\Delta) \triangleq \begin{cases} e^{\frac{j2\pi\Delta p_i(k)}{2P}}, & \text{if } i < M/2 \\ e^{\frac{-j2\pi\Delta p_i(k)}{2P}}, & \text{if } i \geq M/2 \end{cases}$$

being a delay factor of signal delayed by $\Delta$ with frequency index $p_i(k)$, and $\hat{h}_{k,i}$ represents the DFT in the k-th bin at the i-th distortion-less ADC output derived as:

$$\hat{h}_{k,i} \triangleq \left(\hat{H}_{0,i}(k), \hat{H}_{1,i}(k), \ldots, \hat{H}_{M,i}(k)\right)^T$$

$$\hat{H}_{m,i}(k) = \begin{cases} \text{Real}[2\tilde{A}_i(k) E_{m,i}(k)], & \text{if } k = 0 \text{ or } k = P/M \\ \tilde{A}_i(k) E_{m,i}(k), & \text{if } k \neq 0 \text{ or } k \neq P/M \end{cases}$$

$$E_{m,i}(k) \triangleq \begin{cases} e^{\frac{j2\pi m p_i(k)}{2P}}, & \text{if } i < M/2 \\ e^{\frac{-j2\pi m p_i(k)}{2P}}, & \text{if } i \geq M/2 \end{cases}$$

where $\tilde{A}_i(k)$ represents a complex amplitude of an applied sinewave tone after sampling by the i-th ADC without distortion.

10. A machine-implemented method according to claim 9, where the first ADC (m=0) is chosen to be the reference and:

$$h_{k,i}^{(des)} \triangleq (H_{0,i}(k), H_{0,i}(k)E_{1,i}(k), \ldots, (H_{0,i}(k)E_{M-1,i}(k))^T$$

where $H_{0,i}(k)$ represents the DFT in the k-th bin at the first reference ADC output when a single tone having frequency index $p_i(k)$ is applied.

11. A machine-implemented method according to claim 7, further comprising finding a frequency correction matrix $Q_k$ for determining FIR coefficients using a matrix of desired DFTs $H_k^{(des)}$ and measured DFTs $H_k$ through:

$$Q_k = H_k^{(des)} (H_k)^{-1}.$$

12. A machine-implemented method according to claim 11, further comprising repeating frequencies that result in DC frequency and Nyquist frequency components at TIADC individual channel outputs.

13. A machine-implemented method according to claim 12, further comprising sending a 90-degree shifted version of the repeating frequency tone.

14. A machine-implemented method according to claim 11, further comprising finding FIR coefficients from the correction matrixes $Q_k$ for different frequency sets characterized by the parameter k with $q_{l,m}(k)$ being the l,m-th component of the matrix $Q_k$.

* * * * *